(12) United States Patent
Schmid et al.

(10) Patent No.: US 7,758,916 B2
(45) Date of Patent: Jul. 20, 2010

(54) MATERIAL AND METHOD OF MANUFACTURE OF A SOLDER JOINT WITH HIGH THERMAL CONDUCTIVITY AND HIGH ELECTRICAL CONDUCTIVITY

(75) Inventors: Richard K. Schmid, Winterthur (CH); Jacobus C. Doesburg, Westbury, NY (US)

(73) Assignee: Sulzer Metco (US), Inc., Westbury, NY (US)

( * ) Notice: Subject to any disclaimer, the term of this patent is extended or adjusted under 35 U.S.C. 154(b) by 694 days.

(21) Appl. No.: 11/598,062

(22) Filed: Nov. 13, 2006

(65) Prior Publication Data

US 2008/0110531 A1 May 15, 2008

(51) Int. Cl.
*B05D 1/12* (2006.01)
(52) U.S. Cl. ............... 427/191; 427/192; 427/201; 427/427

(58) Field of Classification Search ............... 427/191, 427/192, 201, 427
See application file for complete search history.

(56) References Cited

U.S. PATENT DOCUMENTS

| 6,759,085 B2 | 7/2004 | Muehlberger |
| 2004/0072008 A1* | 4/2004 | Steenkiste et al. ........... 428/553 |
| 2005/0025897 A1* | 2/2005 | Van Steenkiste et al. .... 427/446 |

* cited by examiner

*Primary Examiner*—Frederick J Parker
(74) *Attorney, Agent, or Firm*—Greenblum & Bernstein P.L.C.

(57) ABSTRACT

The present invention provides a powder blend or composite powder that is fed into a kinetic spray device, accelerated towards a substrate or part in order to form a composite solder with thermal and electrical properties better than existing solder. The other advantages of building a solder layer in this manner include a low oxide content to improve subsequent solderability, excellent control of the deposition thickness, excellent control of the deposition chemistry and lastly, high speed of manufacture.

20 Claims, 5 Drawing Sheets

MATERIAL AND METHOD OF MANUFACTURE OF A SOLDER JOINT WITH HIGH THERMAL CONDUCTIVITY AND HIGH ELECTRICAL CONDUCTIVITY

CROSS REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The present invention relates generally to the field of materials technology and more particularly to a solder composition having improved thermal and electrical properties and a method for manufacturing the same.

2. Description of the Related Art

In any circuit involving electrical power, a major design objective is to reduce the temperature of the components, improve reliability, reduce cost, and improve operation. Many integrated circuits ("ICs")—including, for example, dual in-line plastic packaged ICs—have shapes not conducive to fastening directly to the chassis. The packaging method for an IC becomes a limiting factor, as the package serves the function of carrying high current densities in addition to high thermal loads.

In some cases, the design limit of the package becomes the interfaces between the IC and the package, which is itself limited by the manufacturing technique used. A reason for this is that the interface materials best suited for good performance are those that posses both high electrical and thermal conductivity (such as copper or gold). However, these material also have melting points well beyond the manufacturing temperatures that can be tolerated for the IC. Thus, lower melting point solders are typically used to make the interface joint. But these solders do not have an ability to move heat and electrons as well as the interface materials themselves and thus limit the performance potential of the package. There remains a need in the art for a solder joint with improved electrical and thermal conductivity and a melting point low enough to prevent damage to the IC during soldering.

By reducing the thickness of the solder layer, conductive performance is improved. The thickness of the solder layer is limited by the tolerance of the IC and package in addition to the manufacturing method used. Thus, there remains a need in the art for a solder joint that can provide minimal solder thickness for IC applications.

SUMMARY

By combining a solder material and high conductivity (thermal and electrical) material, it is possible to create a composite material that is both solderable at a low temperature and has increased thermal and electrical conductivity compared to using solder alone. The present invention provides a powder blend or composite powder that is fed into a kinetic spray device, accelerated towards a substrate or part in order to form a composite solder with thermal and electrical properties better than conventional solders. The other advantages of building a solder layer in this manner include a low oxide content to improve subsequent solderability, excellent control of the deposition thickness, excellent control of the deposition chemistry and lastly, high speed of manufacture.

In one aspect of the invention, a powder blend for kinetic spraying is provided that contains a solder metal matrix with two parts: (1) one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), and tin-lead (Sn—Pb); and (2) a filler material with high thermal and electrical conductivity of one or more of copper (Cu), gold (Au), nickel (Ni), nickel-gold (Ni—Au), carbon, silver (Ag), aluminum (Al), molybdenum (Mo), nickel (Ni) or nickel-gold (Ni—Au) coated carbon, the platinum group metals (PGM's), and their alloys.

Another aspect of the invention provides a method for manufacturing the powder blend. The method includes the step of providing a solder metal matrix material made of one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), and tin-lead (Sn—Pb)—although Pb has been legislated for removal from solders by the European Parliament Directive 2002/95/EC on the "Restriction of the Use of Certain Hazardous Substances in Electrical and Electronic Equipment" (RoHS), which will be adopted worldwide due to the global nature of the electronics industry; and providing a filler material made of one or more of copper (Cu), gold (Au), nickel (Ni), nickel-gold (Ni—Au), carbon, silver (Ag), aluminum (Al), molybdenum (Mo), nickel (Ni) or nickel-gold (Ni—Au) coated carbon, the platinum group metals (PGM's), and their alloys. The matrix material and filler metal are then each formed into powder particles. Finally, the solder metal matrix powder particles and the filler metal powder particles are blended to a desired ratio for spraying.

In another aspect of the invention, composite powder particles for kinetic spraying are provided with an inside component including filler metal with high thermal and electrical conductivity composed of one or more of copper (Cu), gold (Au), nickel (Ni), nickel-gold (Ni—Au), carbon, silver (Ag), and molybdenum (Mo); and an outside component including a solder metal matrix composed of one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), or tin-lead (Sn—Pb). Alternatively, the inside component may be one or more of alloys based on aluminum (Al), molybdenum (Mo), copper (Cu), gold (Au), silver (Ag), nickel (Ni) or nickel-gold (Ni—Au) coated carbon (typically graphite, diamond or carbon nanotubes—SWNT), or the platinum group metals (PGM's).

Yet another aspect of the invention includes methods for manufacturing the composite powder is also provided. The method of manufacture includes the step of providing an inside particle component made of a filler metal with high thermal and electrical conductivity, such as one or more of copper (Cu), gold (Au), nickel (Ni), nickel-gold (Ni—Au), carbon, silver (Ag), molybdenum (Mo), and any alloys thereof. Next, the inside component is formed into powder particles. An outside component made of one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), or tin-lead (Sn—Pb) is provided. And finally, the outside component is deposited onto the inside component using one or more of electrochemical methods, chemical methods, physical vapor deposition (PVD), or mechanical cladding.

In other aspects of the invention, a method of applying composite solder materials is provided. The method includes the steps of providing powder materials comprising a solid metal matrix material and a filler material each in accordance with the material composition described above; supplying the powder materials to a kinetic spraying apparatus; and spraying the powder materials through a convergent-divergent nozzle onto the substrate at pressure less than or equal to ambient.

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Reference will now be made in detail to the preferred embodiments of the present invention, examples of which are illustrated in the accompanying drawings.

Figure 1:
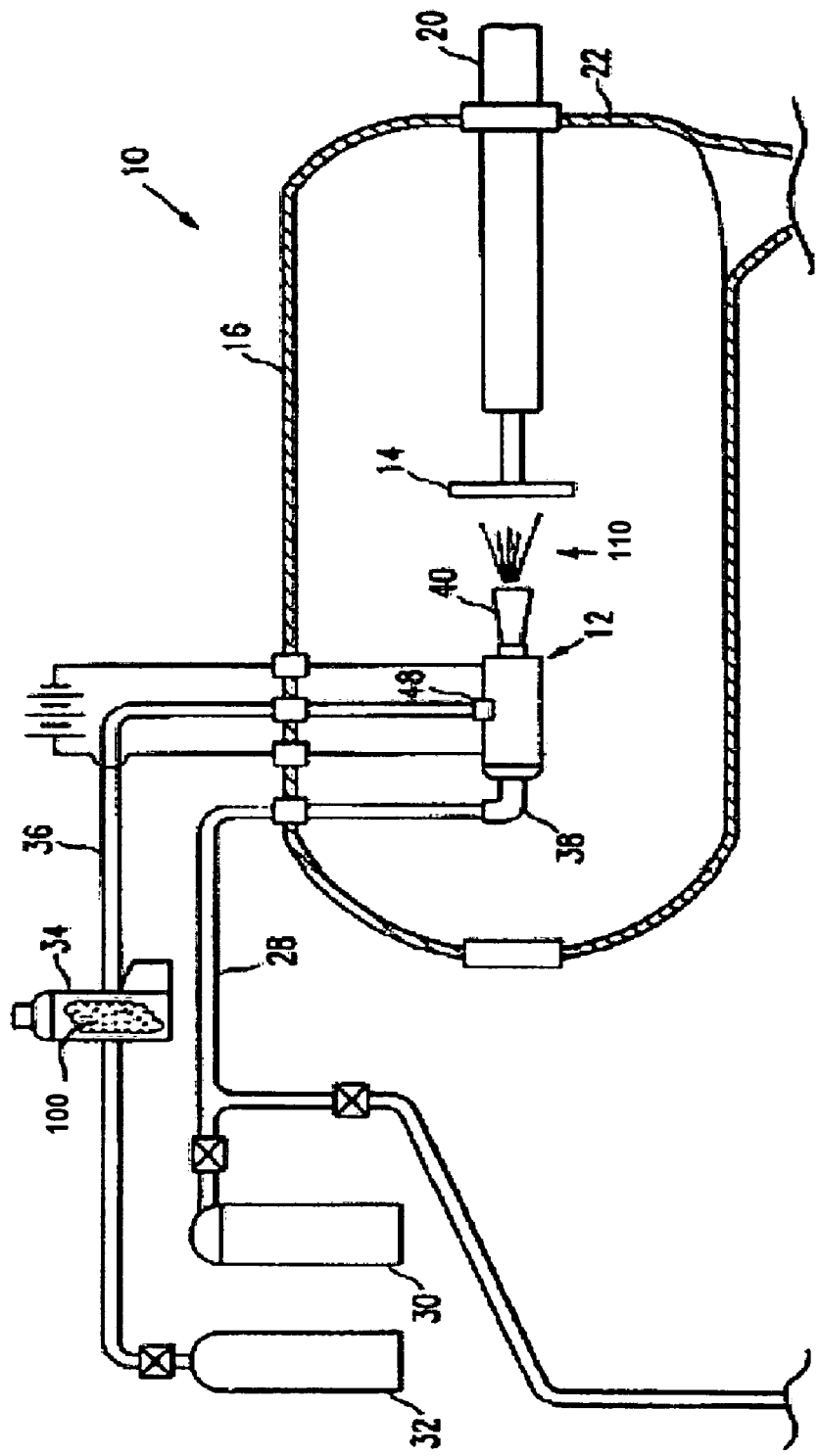
FIG. 1 is a schematic of a typical kinetic spray system for use with the present invention.

The composite material of the present invention may be used in a kinetic spray system. FIG. 1 shows a kinetic spray system 10 for use in accordance with the present invention. The system 10 includes a kinetic spray gun 12 which is mounted together with a workpiece 14 within the hollow interior of a vacuum tank 16. The kinetic spray gun 12 is disposed relative to the workpiece 14 for directing a spray 110 onto the workpiece 14. The workpiece 14 may be mounted on a workpiece manipulation device 20 mounted through a wall of the vacuum tank 16 and extending into the interior of the vacuum tank 16.

As shown in the typical system 10 of FIG. 1, the kinetic spray gun 12 produces a cold spray for direction onto the workpiece 14 in response to a main gas flow under pressure and a powder gas which carries a composite powder 100 according to the present invention. The main gas flow is provided to the kinetic spray gun 12 by a main gas line 28 from a first gas supply in the form of a storage container 30. The gas in storage container 30 may be helium, argon, nitrogen or air, for example. The composite powder 100 is provided in a flow of gas by a second gas supply or storage container 32 in combination with a powder feeder 34. The second gas storage container 32 provides a flow of powder gas (for example, helium, argon, nitrogen or air) through a powder gas line 36 extending through the powder feeder 34. The powder feeder 34 feeds the composite powder 100 into the flow of gas in the powder gas line 36 for feeding of the powder to the kinetic spray gun 12.

The gas from the first gas storage container 30 flows through the main gas line 28 to an input end 38 of the kinetic spray gun 12. From the input end 38, the gas flows through an optional heating coil (not shown) to a spray nozzle 40 at an opposite end of the kinetic spray gun 12 from the input end 38. The powder feeder 34 feeds the composite powder 100 into the flow of powder gas traveling through the powder gas line 36. The gas from supply 32 and the composite powder 100 mix as the gas passes through powder feeder 34 to provide a mixture of powder and gas. The ratio of gas from supply 32 and powder 100 can be varied to meet desired application criteria. As shown in FIG. 1, the powder gas line 36 extends through the wall of the vacuum tank 16 to a connecting point 48 along the kinetic spray gun 12. Inside the kinetic spray gun 12, the gases and powder are directed through spray nozzle 40 and accelerated onto the substrate workpiece 14.

The composite powder 100 of the present invention includes a filler material and a solder metal matrix for use in a kinetic spray system such as that described above with respect to FIG. 1. The solder matrix is made up of a low melting point solder material such as tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), or tin-lead (Sn—Pb). The matrix is required to be low in melting temperature, have good flowability while molten and must also be able to wet the filler and interface metal. The solder metal matrix can also be an alloy that dissolves into the filler material. The solder metal matrix can make up between about 10 and 90 volume percent of the overall coating, with a typical composition of solder metal matrix being between about 20 and 40 volume percent in order to achieve suitable coverage of the filler material in addition to maximizing the benefit of the filler material.

The filler material of the composite powder 100 consists of a soft metal or metal alloy that is high in both thermal and electrical conductivity. The filler material has a melting point that is higher than that of the solder matrix, and must be able to be wetted by the solder metal matrix. Alternately, the solder metal matrix can dissolve into the filler metal to form a metallurgical bond. The filler material (e.g., a metal or carbon in graphite, diamond or carbon nanotubes—SWNT) can be composed of any relatively soft and highly conductive metal or alloy. Metal systems that meet these criteria include copper (Cu), gold (Au), nickel (Ni), nickel-gold (Ni—Au), carbon (typically graphite, diamond or carbon nanotubes—SWNT), and silver (Ag) or any alloy combination thereof. Other metal alloy systems possible are those based on aluminum, molybdenum, nickel or the platinum group metals (PGM's). The filler material can make up about 10 to 90 volume percent of the coating, with a typical composition being between about 60 and 80 volume percent in order to maximize the advantages brought by using a metal system with high thermal and electrical conductivity.

Figure 2:
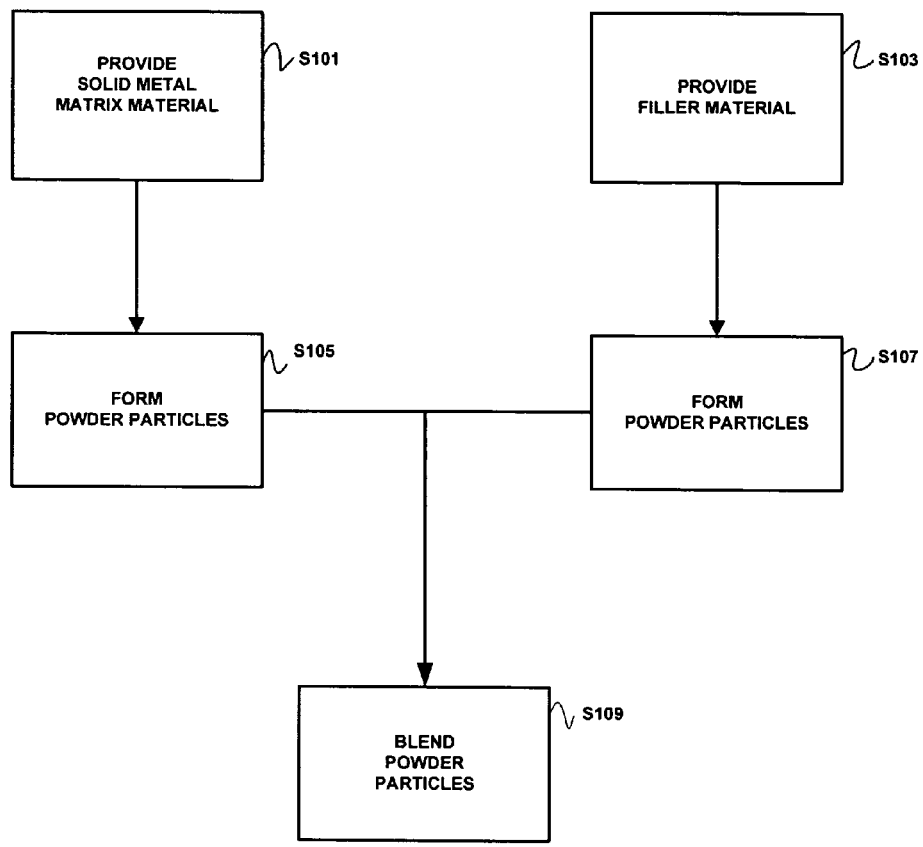
FIG. 2 shows a process flow for the method of producing a powder blend in accordance with the present invention.

The metals for composite powder 100 can be manufactured in a number of ways. In general, metals produced for kinetic spraying are delivered in powder form, since the kinetic spray apparatus functions by delivering spherical powder to the part at very high velocities. FIG. 2 shows a process flow for a method of producing composite powder blend in accordance with the present invention. In steps S101 and S103 the base materials are provided for the solid metal matrix and filler material, respectively. In step S105, the base solid metal matrix material is formed into powder particles. The most common manner of producing the powder is by gas atomization, as smooth, spherical powders are manufactured. Other methods of powder formation are, but not limited to, water atomization, or chemical precipitation. The size of the metal matrix powder particles is less than about 90 microns and greater than about 5 microns and must be generally free flowing (e.g., the particles do not adhere to one another). Similarly, in step S107, the filler material is formed into powder particles. The powder formation process in step S107 for the filler material may use, but is not required to use, the same powder formation technique as in step S105—any of gas atomization, water atomization, or chemical precipitation may be used. The size of the filler material powder particles is less than about 90 microns and greater than about 5 microns and must be generally free flowing. The gas atomization process can be performed in either an inert atmosphere or else in vacuum. The advantage of using inert atmosphere or vacuum for atomizing is that low oxygen content can be realized in the powder produced, which becomes important when the deposited coating is to be soldered.

As shown in step S109 of FIG. 2, the two powder components are blended in the desired ratio prior to spraying using a device such as a V-blender. The two powder components may exhibit different temperatures and velocities due to differences in density, thermal conductivity an heat capacity as they are propelled from the spray gun nozzle. Depending on the in-flight characteristics of the solder metal matrix powder and the filler material powder, the blend ratio is adjusted so that the resulting coating will have the desired volume fractions of the constituents. In another embodiment, co-injection of two powder components may be used in lieu of a separate blending step.

Figure 3:
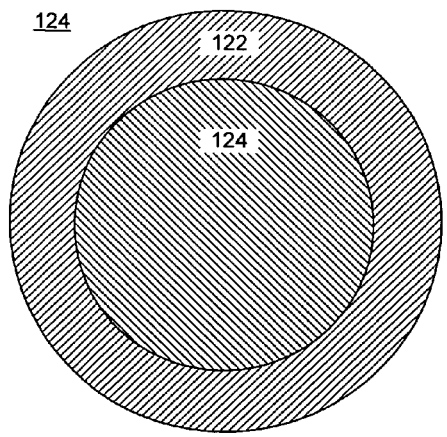
FIG. 3 is a schematic of a composite powder particle in accordance with an embodiment of the present invention.

Another option for manufacturing the powder is to create a composite powder particle so that production issues involved in blending and feeding, such as powder separation, are avoided. FIG. 3 provides a sketch of a composite powder particle in accordance with the present invention. FIG. 3 shows particle 120 that includes a filler material 124 surrounded with an outer shell of solder metal matrix 122. The volume occupied by the filler material is between about 50 and 90 percent, preferably between about 60 and 80 percent. The size of the composite powder particles is less than about 90 microns and greater than about 5 microns and must be generally free flowing.

Figure 4:
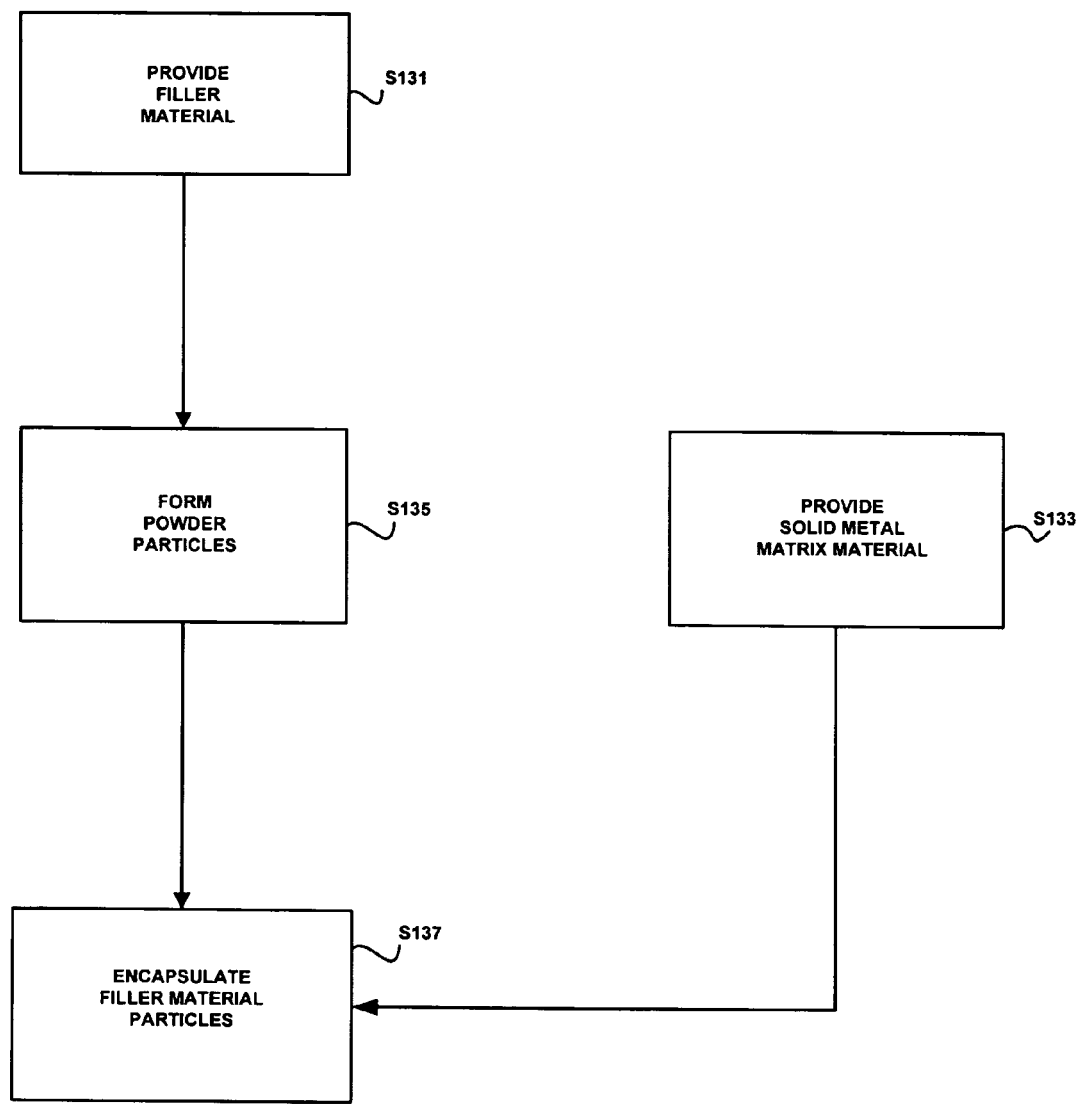
FIG. 4 shows a process flow for the method of producing composite powder particles in accordance with the present invention.

FIG. 4 shows a process flow for the method of producing composite powder particles in accordance with the present invention. In steps S131 and S133, the base materials are provided for the filler material and solid metal matrix, respectively. In step S135, the filler material is formed into powder particles. As discussed above with respect to FIG. 2, any of gas atomization, water atomization, or chemical precipitation processes may be used to form the filler material powder. To create a useful composite powder particle, in step S137 the solder metal matrix material is deposited onto the filler material particles using a suitable technique. Suitable methods for accomplishing encapsulation in step S137 include electrochemical methods, physical vapor deposition (PVD), or mechanical cladding.

Figure 7:
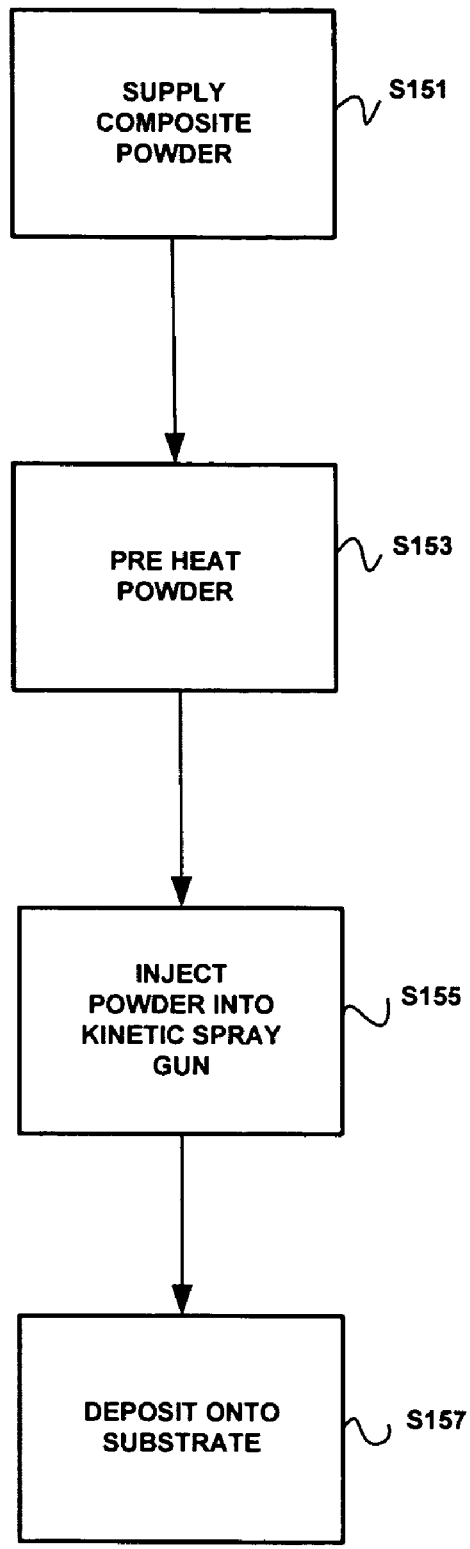
FIG. 7 provides a process flow for producing a solder coating onto a substrate in accordance with an embodiment of the present invention.

Referring generally to FIGS. 1 and 7, kinetic spraying involves accelerating composite powder particles 100 towards a substrate (e.g., workpiece 14) at very high velocities, much greater than the speed of sound. FIG. 7 provides a process flow for producing a solder coating onto a substrate. In step S151, the composite powder 100 is provided for the kinetic spray system. For the system configuration show in FIG. 1, the powder may be supplied as a pre-blended powder or as composite particles. In another embodiment, the powder is preheated in step S153. In another embodiment, the solid metal matrix and the filler material powder components of composite powder 100 may be fed separately into kinetic spray gun 12 and blended as the particles pass through the kinetic spray gun 12. The composite powder 100 is injected into the kinetic spraying device 12 in step S155. The composite powder 100 is accelerated to supersonic velocities by injection into a high velocity gas stream. The gas is accelerated in the kinetic spraying device 12 by pressurizing the gas and subsequently expanding it through a properly sized convergent-divergent nozzle 40. The inlet and outlet pressures combined with the nozzle 40 dimensions and gas flow determine the exit velocity of the gas. The outlet pressure can be either ambient, or otherwise any pressure lower than ambient. These conditions are described in U.S. Pat. No. 6,759,085, titled "Method and Apparatus for Low Pressure Cold Spraying," commonly-assigned with the present invention.

Figure 5:
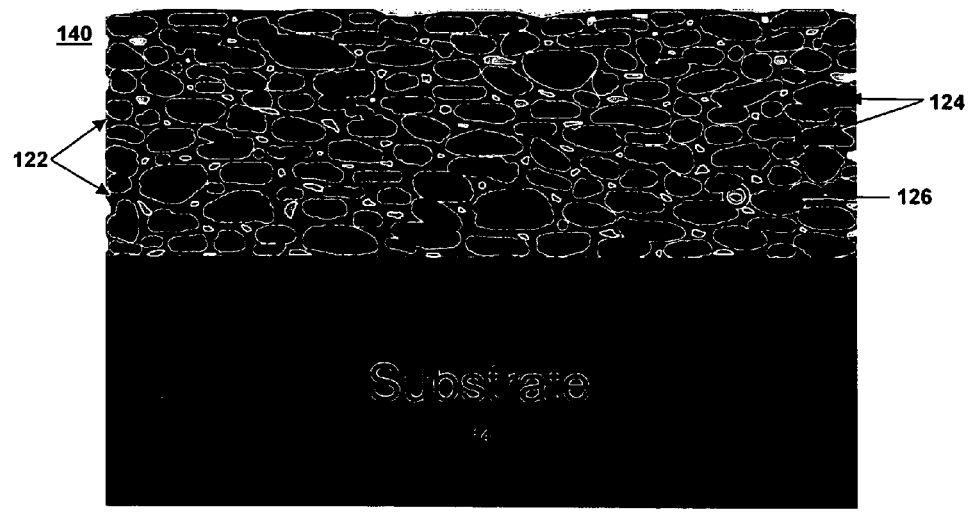
FIG. 5 is a schematic of an applied solder coating prior to soldering in accordance with an embodiment of the present invention.

After the powder 100 is injected into the nozzle, it travels in step S155, to the substrate 14 in the form of spray 110. A coating is formed by the transfer of the powder's 100 kinetic energy into thermal energy upon impact, forming a mechanical bond with either the substrate 14 or previously deposited material. In this manner, it is possible to form a very dense coating without having thermal reactions occur within the powder in flight such as is the case with other forms of spray deposition such as plasma spraying, flame spraying or high velocity oxy-fuel (HVOF) spraying. An example of such a solder coating is given in FIG. 5, showing a schematic of an applied solder coating prior to soldering in accordance with an embodiment of the present invention. In FIG. 5, a coating 140 is bonded to the substrate 14, with the coating containing densely-packed filler material particles 124 generally surrounded by the solder metal matrix 122. There may be present in this composite solder coating up to 1 volume percent porosity 126, which will disappear during the soldering step.

Use of the kinetic spray process provides an advantage over high temperature thermal spray systems by suppressing thermal reactions during flight. This means that composite coatings of metals which would normally react with each other or the environment during spraying can be used and, thus, composite coatings of metals which have very dissimilar melting points can be achieved. This is the case with co-spraying a low melting solder matrix in conjunction with a higher melting point filler material, as in the present invention.

Once the solder coating has been deposited, it can be soldered using a suitable technique such as, SMT (Surface Mount Technology) reflow or wave soldering. The coating of the present invention has advantages with regards to soldering over other solders in that it has both low oxide content and high density so that a consistent solder joint is possible. It is also possible to develop diffusion bonding by choosing a filler material and solder metal matrix combination, such as copper and indium, that are soluble in each other. In some cases, it may be possible to achieve joining at temperatures below the melting point of the solder material.

Figure 6:
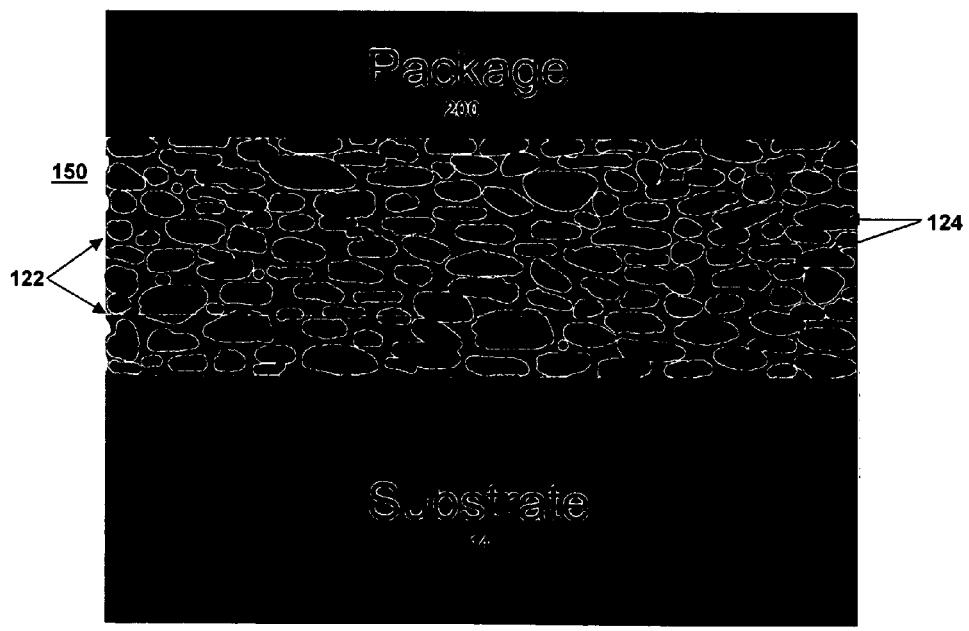
FIG. 6 is a schematic of an applied solder coating after soldering in accordance with an embodiment of the present invention.

An example of the coating structure of a soldered joint is given in FIG. 6, showing a schematic of an applied solder coating 150 after soldering in accordance with an embodiment of the present invention. The coating 150 is bonded to the substrate 14, with the coating containing densely-packed filler material particles 124 generally surrounded by the solder metal matrix 122. An IC package 200 is joined to the substrate 14 by the solder coating 150.

While exemplary embodiments of the invention have been shown and described herein, it will be obvious to those skilled in the art that such embodiments are provided by way of example only. Numerous insubstantial variations, changes, and substitutions will now be apparent to those skilled in the art without departing from the scope of the invention disclosed herein by the Applicants. Accordingly, it is intended that the invention be limited only by the spirit and scope of the claims, as they will be allowed.

We claim:

1. A method of forming a composite solder coating on a substrate comprising the steps of:
providing powder materials comprising a solid metal matrix material and a filler material, wherein said solid metal matrix material is one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), and tin-lead (Sn—Pb), and wherein said filler material is one or more of copper (Cu), gold (Au), nickel (Ni), nickel-gold (Ni—Au), carbon, silver (Ag), aluminum (Al), molybdenum (Mo), nickel (Ni) or nickel-gold (Ni—Au) coated carbon, the platinum group metals (PGM's), and their alloys;
supplying the powder materials to a kinetic spraying apparatus; and
spraying the powder materials through a convergent-divergent nozzle onto the substrate at pressure less than or equal to ambient in order to form the composite solder coating.

2. The method of claim 1, wherein the powder material is a blend of separate solid metal matrix material particles and filler material particles.

3. The method of claim 1, wherein the powder material is a composite powder with particles having an inside component of the filler material and an outside component of the solid metal matrix material.

4. The method of claim 1, wherein the spraying is conducted under vacuum conditions.

5. The method of claim 1, further comprising the step of preheating the powder materials to temperatures above ambient.

6. The method of claim 1, wherein the volume fraction of the solid metal matrix material in the composite solder coating is between about 10 and 90 percent and the volume fraction of the filler material in the composite solder coating is between about 10 and 90 percent.

7. The method of claim 1, wherein the volume fraction of the solid metal matrix material in the composite solder coating is between about 20 and 40 percent and the volume fraction of the filler material in the composite solder coating is between about 60 and 80 percent.

8. The method of claim 1, wherein the filler material has a melting point that is higher than a melting point of the solid metal matrix material.

9. The method of claim 1, wherein the solid metal matrix material is a solder metal matrix material.

10. The method of claim 1, further comprising, prior to spraying, blending particles of the filler material and particles of the solid metal matrix material.

11. The method of claim 1, further comprising, after the spraying, forming a solder joint using the composite solder coating.

12. A method of forming a composite solder coating on a substrate comprising the steps of
forming a powder comprising a solder metal matrix material and a filler material, wherein said solder metal matrix material is one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), and tin-lead (Sn—Pb), and wherein said filler material is one or more of copper (Cu), gold (Au), nickel (Ni), nickel-gold (Ni—Au), carbon, silver (Ag), aluminum (Al), molybdenum (Mo), nickel (Ni) or nickel-gold (Ni—Au) coated carbon, the platinum group metals (PGM's), and their alloys;
supplying the powder to a kinetic spraying apparatus; and
spraying the powder through a convergent-divergent nozzle onto the substrate at pressure less than or equal to ambient in order to form the composite solder coating.

13. The method of claim 12, wherein the filler material has a melting point that is higher than a melting point of the solder metal matrix material.

14. The method of claim 12, wherein the powder is a blend of separate solder metal matrix material particles and filler material particles.

15. The method of claim 12, wherein the powder is a composite powder with particles having an inside component of the filler material and an outside component of the solder metal matrix material.

16. The method of claim 12, wherein the volume fraction of the solder metal matrix material in the composite solder coating is between about 10 and 90 percent and the volume fraction of the filler material in the composite solder coating is between about 10 and 90 percent.

17. The method of claim 12, wherein the volume fraction of the solder metal matrix material in the composite solder coating is between about 20 and 40 percent and the volume fraction of the filler material in the composite solder coating is between about 60 and 80 percent.

18. A method of forming a composite solder coating on a substrate comprising the steps of:
forming a powder comprising particles, wherein the particles have an inside component of a filler material and an outside component of a solder metal matrix material, said solder metal matrix material is one or more of tin-silver-copper (Sn—Ag—Cu), tin-copper (Sn—Cu), tin-copper-nickel (Sn—Cu—Ni), tin-silver (Sn—Ag), tin-silver-bismuth (Sn—Ag—Bi), tin-bismuth-indium (Sn—Bi—In), tin-gold (Au—Sn), tin-zinc (Sn—Zn), tin-zinc-bismuth (Sn—Zn—Bi), tin-bismuth-silver (Sn—Bi—Ag), tin (Sn), tin-indium (Sn—In), indium (In), indium-silver (In—Ag), and tin-lead (Sn—Pb), and wherein said filler material is one or more of copper (Cu), gold (Au), nickel (Ni), nickel-gold (Ni—Au), carbon, silver (Ag), aluminum (Al), molybdenum (Mo), nickel (Ni) or nickel-gold (Ni—Au) coated carbon, the platinum group metals (PGM's), and their alloys;

supplying the powder to a kinetic spraying apparatus; and spraying the powder onto the substrate in order to form the composite solder coating.

19. The method of claim 18, wherein the filler material has a melting point that is higher than a melting point of the solder metal matrix material.

20. The method of claim 18, further comprising:

after the spraying, forming a solder joint with the composite solder coating.

* * * * *